United States Patent
Shen

(10) Patent No.: US 12,189,541 B1
(45) Date of Patent: Jan. 7, 2025

(54) MEMORY DEVICE AND CONTROL METHOD FOR CONTROLLING MEMORY DEVICE

(71) Applicant: NANYA TECHNOLOGY CORPORATION, New Taipei (TW)

(72) Inventor: William Wu Shen, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/456,537

(22) Filed: Aug. 28, 2023

(51) Int. Cl.
    *G06F 12/14* (2006.01)
(52) U.S. Cl.
    CPC ...... *G06F 12/14* (2013.01); *G06F 2212/1052* (2013.01)
(58) Field of Classification Search
    None
    See application file for complete search history.

(56) References Cited

U.S. PATENT DOCUMENTS

| | | | |
|---|---|---|---|
| 9,032,141 | B2 | 5/2015 | Bains et al. |
| 9,721,643 | B2 | 8/2017 | Bains et al. |
| 9,799,390 | B2 | 10/2017 | Song |
| 10,102,886 | B2 | 10/2018 | Crawford et al. |
| 10,825,534 | B2 | 11/2020 | Nale |
| 11,257,535 | B2 | 2/2022 | Shore et al. |
| 2014/0085995 | A1 | 3/2014 | Greenfield et al. |
| 2015/0109871 | A1* | 4/2015 | Bains ............... G11C 11/40611 365/222 |
| 2016/0099043 | A1* | 4/2016 | Tu ................ G11C 11/40615 365/222 |
| 2019/0066759 | A1 | 2/2019 | Nale |
| 2020/0294569 | A1 | 9/2020 | Wu et al. |
| 2020/0294608 | A1 | 9/2020 | Zhu et al. |
| 2022/0129200 | A1 | 4/2022 | Van Der Veen et al. |
| 2022/0188024 | A1* | 6/2022 | Brandl .................. G06F 3/0604 |
| 2022/0189532 | A1* | 6/2022 | Nale ................ G11C 11/40611 |
| 2023/0047007 | A1* | 2/2023 | Lovett .............. G11C 11/40615 |

OTHER PUBLICATIONS

William Wu Shen et al., "Memory Device and Control Method for Controlling Memory Device", Unpublished U.S. Appl. No. 18/350,753, filed Jul. 12, 2023.
"Office Action of Taiwan Counterpart Application", issued on Oct. 23, 2024, p. 1-p. 8.

* cited by examiner

*Primary Examiner* — Tracy C Chan
(74) *Attorney, Agent, or Firm* — JCIPRNET

(57) ABSTRACT

A memory device and a control method of the memory device are provided. The memory device includes a memory array and a control logic circuit. The memory array includes memory cell rows. The control logic circuit includes a counter and a reset circuit. The counter counts a number of an access performed on the memory cell rows to generate a count value corresponding to the accessed memory cell row among the memory cell rows, and sets the count value to a random value when the count value is equal to the predetermined value and when the access is performed. The reset circuit resets the count value to a predetermined value in responses to a refresh command. When the count value reaches to the threshold value, the control logic circuit arranges memory cell rows nearby the accessed memory cell row into a mitigation operation.

13 Claims, 4 Drawing Sheets

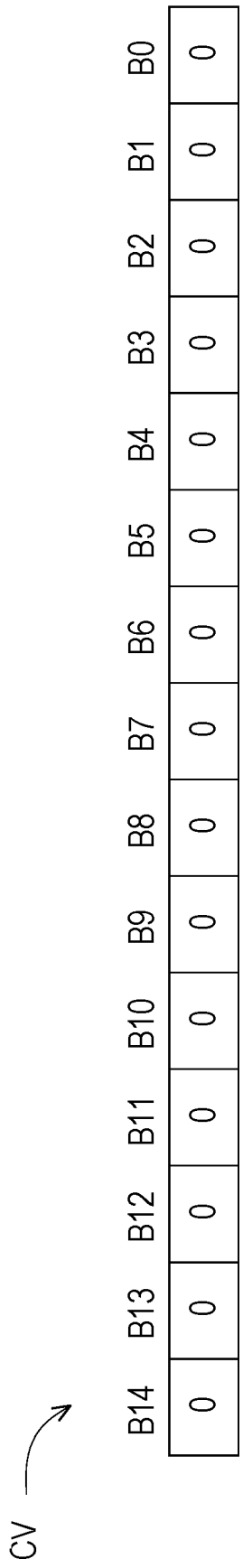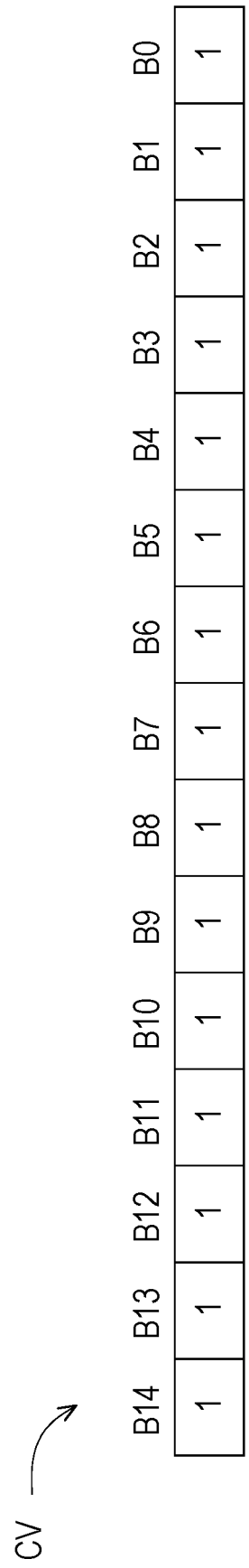
FIG. 2A
FIG. 2B

MEMORY DEVICE AND CONTROL METHOD FOR CONTROLLING MEMORY DEVICE

BACKGROUND

Technical Field

The disclosure generally relates to a memory device and a control method for controlling the memory device, and more particularly to a memory device and a control method for mitigating a row-hammer attacks.

Description of Related Art

Generally, a memory device performs a mitigation operation on memory cell rows in a memory array to prevent row-hammer event. When an access number on a memory cell row reaches a threshold value. The memory device performs the mitigation operation to refresh the memory cell rows nearby the memory cell row been frequently accessed within a short time period.

However, external attackers (for example, hacker or malicious program) obtain the mitigation operation according to the threshold value and count value corresponding to the access number. Thus, according to the threshold value and the count value, the external attackers may focus on writing to a specific memory cell row or make lots of access numbers reach the threshold value within a very short period. Above row-hammer attacks may make the memory device busy to decrease an efficacy of the memory device or disturb the specific memory cell. Therefore, how to mitigating the row-hammer attacks is one of the research and development focuses of those skilled in the art.

SUMMARY

The disclosure provides a memory device and a control method of the memory device for mitigating a row-hammer attacks on the memory device.

The memory device includes a memory array and a control logic circuit. The memory array includes a plurality of memory cell rows. The control logic circuit is coupled to the memory array. The control logic circuit performs an access on the memory array. The control logic circuit includes a counter, a reset circuit and a comparator. The counter counts a number of the access performed on the plurality of memory cell rows to generate a count value corresponding to an accessed memory cell row among the plurality of memory cell rows, and sets the count value to a random value when the count value is equal to the predetermined value and when the access is performed. The reset circuit resets the count value to a predetermined value in responses to a refresh command. The comparator compares a threshold value and the count value. When the count value corresponding to the accessed memory cell row reaches to the threshold value, the control logic circuit arranges memory cell rows nearby the accessed memory cell row into a mitigation operation.

The control method for controlling a memory device includes: providing a count value corresponding to an accessed memory cell row among a plurality of memory cell rows of a memory array of the memory device; resetting the count value to a predetermined value in responses to a refresh command; setting the count value to a random value when the count value is equal to the predetermined value and when the access is performed; comparing the count value and the threshold value; and arranging memory cell rows nearby the accessed memory cell row into a mitigation operation when the count value corresponding to the accessed memory cell row reaches to the threshold value.

Based on the above, the count value is reset to the predetermined value in responses to the refresh command. The count value is set to the random value when the count value is equal to the predetermined value and when the access is performed. The count value is set to the random value when the access is performed after being reset. Therefore, external attackers (for example, hacker or malicious program) cannot obtain the count value having the random value. The external attacker cannot obtain the mitigation operation of row-hammer of the disclosure. Therefore, the memory device mitigates the row-hammer attacks.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A and FIG. 2B illustrate schematic diagrams of a count value according to an embodiment of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Figure 1:
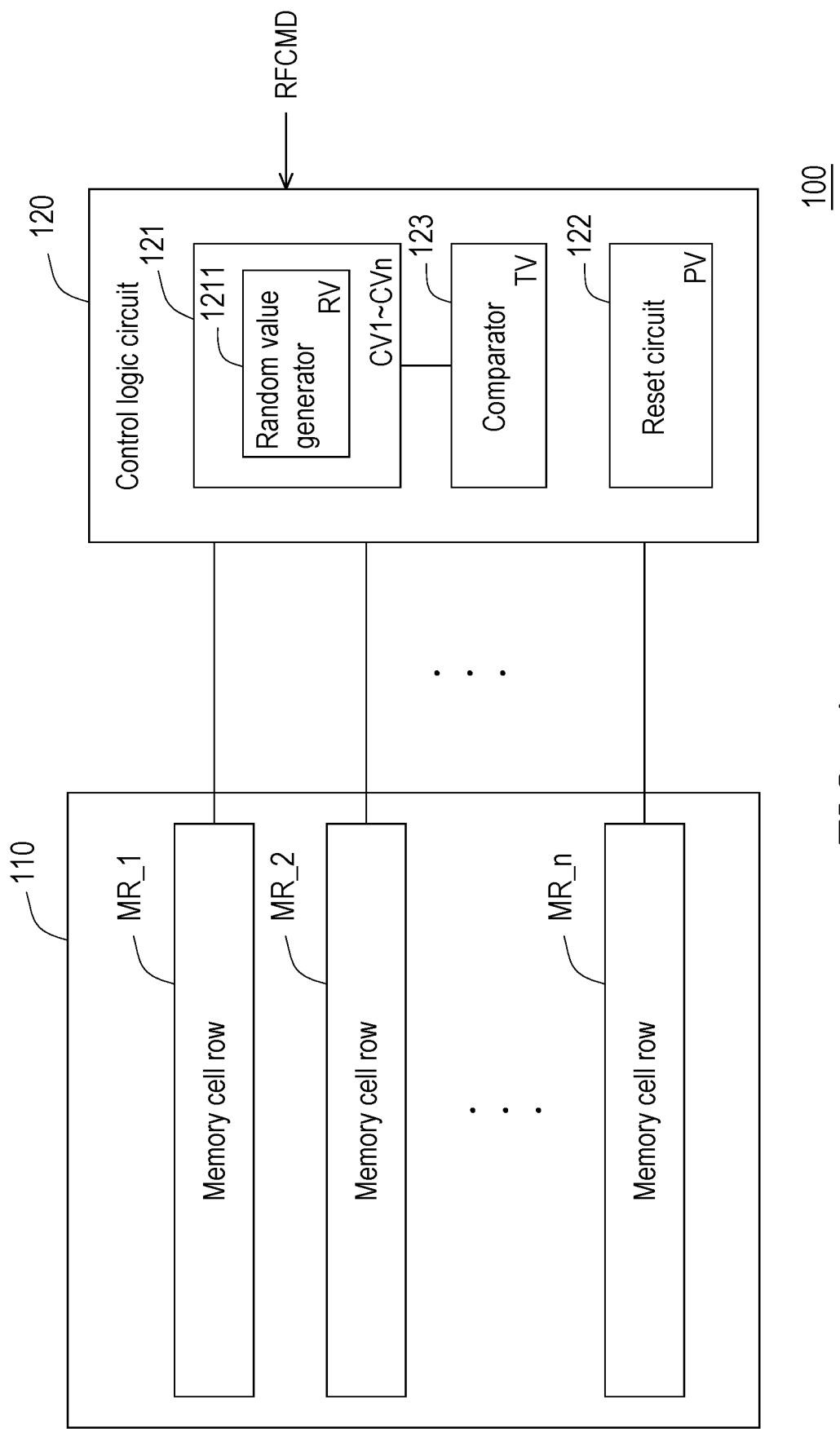
FIG. 1 illustrates a schematic diagram of a control circuit and an image sensor according to a first embodiment of the disclosure.

FIG. 1 illustrates a schematic diagram of a control circuit according to a first embodiment of the disclosure. Please refer to FIG. 1, in the embodiment, the memory device 100 includes a memory array 110 and a control logic circuit 120. The memory array 110 may be a DRAM memory array, but the disclosure is not limited thereto. The memory array 110 includes memory cell rows MR_1 to MR_n. The control logic circuit 120 is coupled to the memory array. The control logic circuit 120 performs an access on the memory array 120. In the embodiment, the access at least includes write operation or read operation. Besides, the control logic circuit 120 sets count value corresponding to accessed memory cell row.

In the embodiment, the control logic circuit 120 includes a counter 121, a reset circuit 122 and a comparator 123. The counter 121 counts a number of the access performed on the memory cell rows MR_1 to MR_n to generate count values CV1 to CVn corresponding to the memory cell rows MR_1 to MR_n. For example, the count value CV1 corresponds to the memory cell row MR_1. The count value CV2 corresponds to the memory cell row MR_2, and so on. For example, when the access is performed on the memory cell row MR_1, the counter 121 increments the count value CV1 by a positive integer (for example, "1").

The reset circuit 122 resets the count value to a predetermined value PV in responses to a refresh command RFCMD. When receiving the refresh command RFCMD, the control logic circuit 120 refreshes (for example, rewrites or precharges) data in at least one of the memory cell rows MR_1 to MR_n. For example, when receiving the refresh command RFCMD for the memory cell row MR_1, the control logic circuit 120 refreshes data in the memory cell row MR_1. The reset circuit 122 resets the count value CV1 to the predetermined value PV in responses to the refresh command RFCMD for the memory cell row MR_1. Therefore, when receiving the refresh command RFCMD for the memory cell row MR_1, the count value CV1 has the predetermined value PV. In other words, when receiving the refresh command RFCMD for the memory cell row MR_1, the count value CV1 is equal to the predetermined value PV.

In the embodiment, when the access is performed, the counter 121 determines count value corresponding to accessed memory cell row. When the count value is equal to the predetermined value PV, the counter 121 sets the count value to a random value RV. On the other hand, when the count value is not equal to the predetermined value PV, the counter 121 does not set the count value of the accessed memory cell row when the access is performed.

For example, when the access is performed on the memory cell row MR_m ("m" is lower than or equal to "n"), the counter 121 determines the count value CVm corresponding to the memory cell row MR_m (that is, the accessed memory cell row). When the count value CVm is equal to the predetermined value PV, the counter 121 sets the count value CVm to a random value RV. On the other hand, when the count value CVm is not equal to the predetermined value PV, the counter 121 does not set the count value CVm when the access is performed on the memory cell row MR_m.

In the embodiment, the comparator 123 compares a threshold value TV and the count value. When the count value corresponding to the accessed memory cell row reaches to the threshold value TV, the control logic circuit 120 arranges memory cell rows nearby the accessed memory cell row into a mitigation operation of row-hammer. On the other hand, when the count value is lower than the threshold value TV, the counter 121 increments the count value of the accessed memory cell row when the access is performed.

For example, when the count value CVm is reach to the threshold value TV, the control logic circuit 120 arranges memory cell rows MR_(m−1) and MR_(m+1) nearby the memory cell row MR_m into the mitigation operation. On the other hand, when the count value CVm is not reach to the threshold value TV, the counter 121 increments the count value CVm when the access is performed on the memory cell row MR_m.

In some embodiments, when the count value CVm is reach to the threshold value TV, the control logic circuit 120 arranges memory cell rows MR_(m−2), MR_(m−1), MR_(m+1) and MR_(m+2) into the mitigation operation.

In some embodiments, when the count value CVm is reach to the threshold value TV, the control logic circuit 120 arranges memory cell rows MR_(m−1), MR_m and MR_(m+1) into the mitigation operation.

It should be noted, the reset circuit 122 resets the count value (for example, the count value CVm) to the predetermined value PV in responses to the refresh command RFCMD. The counter 121 sets the count value corresponding to the accessed memory cell row (for example, the memory cell row MR_m) to the random value RV when the count value is equal to the predetermined value PV and when the access is performed. The count value is set to the random value RV when the access is performed after being reset. Therefore, external attackers (for example, hacker or malicious program) cannot obtain the count value having the random value RV. The external attacker cannot obtain the mitigation operation of row-hammer of the disclosure. Therefore, the memory device mitigates a row-hammer attacks.

In the embodiment, the counter 121 includes a random value generator 1211. The random value generator 1211 generates the random value RV. For example, the random value generator 1211 generates the random value RV with a linear feedback shift register (LFSR). For example, the random value generator 1211 includes a Fibonacci-type LFSR or a Galois-type LFSR.

For example, the random value generator 1211 generates the random value RV per one access. For example, the random value generator 1211 generates the random value RV when any one of the count values CV1 to CVn is equal to the predetermined value PV.

In the embodiment, each the count values CV1 to CVn is stored in the corresponding rows respectively. For example, the count value CV1 is stored in the memory cell row MR_1. The count value CV2 is stored in the memory cell row MR_2, and so on.

FIG. 2A and FIG. 2B illustrate schematic diagrams of a count value according to an embodiment of the disclosure. Please refer to FIG. 1, FIG. 2A and FIG. 2B, in the embodiment, the count value CV includes bit values B0 to B14, but the disclosure is not limited thereto. The reset circuit 122 resets the bit values B0 to B14 to a same logic value in responses to the refresh command RFCMD. For example, the reset circuit 122 resets the bit values B0 to B14 to logic value "0" in responses to the refresh command RFCMD as shown in FIG. 2A. For example, the reset circuit 122 resets the bit values B0 to B14 to logic value "1" in responses to the refresh command RFCMD as shown in FIG. 2B.

Figure 3:
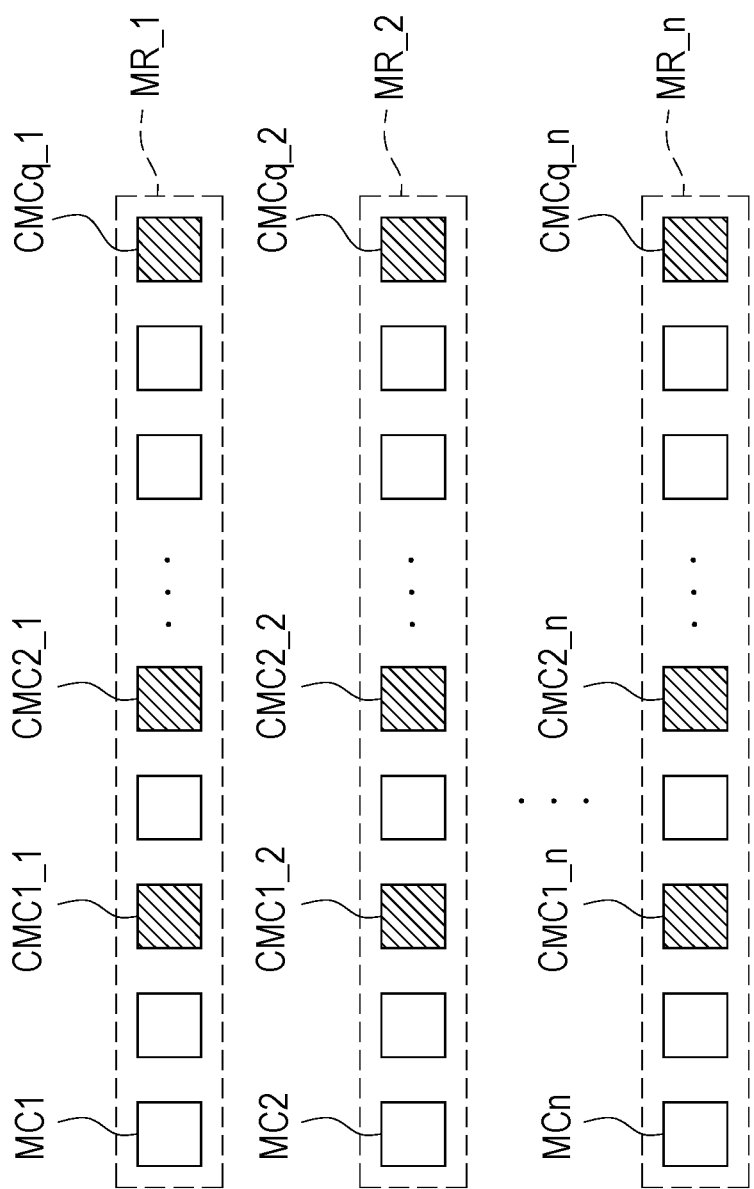
FIG. 3 illustrates a schematic diagram of a memory array according to an embodiment of the disclosure.

FIG. 3 illustrates a schematic diagram of a memory array according to an embodiment of the disclosure. Please refer to FIG. 1 and FIG. 3, in the embodiment, the memory array 210 includes memory cell rows MR_1 to MR_n. The memory cell rows MR_1 includes a data cells MC1 and count value cells CMC1-1 to CMCq_1. The memory cell rows MR_2 includes a data cells MC2 and count value cells CMC1-2 to CMCq_2. The memory cell rows MR_n includes a data cells MCn and count value cells CMC1_n to CMCq_n. The data cells MC1 is used to store data. The count value cells CMC1-1 to CMCq_1 store the count value CV1. The data cells MC2 is used to store data. The count value cells CMC1-2 to CMCq_2 store the count value CV2. The data cells MCn is used to store data. The count value cells CMC1_n to CMCq_n store the count value CVn.

In the embodiment, each of the memory cell rows MR_1~MR_n corresponds one different word line. For example, when the memory cell row MR_1 is asserted by a word line signal on a first word line, the count value CV1 may be readout or be written. For example, the count value CV1 may be readout or be written by an input/output circuit, a sensing amplifier and a voltage equalization circuit descripted in U.S. application Ser. No. 18/350,753.

Besides, the memory cells CMC1-1 to CMC1_n are formed as a first memory cell column. The memory cells CMC2-1 to CMC2_n are formed as a second memory cell column. The memory cells CMCq_1 to CMCq_n are formed as a third memory cell column.

Taking the memory cell row MR_1 as an example, the count value cells CMC1-1 to CMCq_1 are not adjacent from each other, but the disclosure is not limited thereto. In some embodiments, the count value cells CMC1-1 to CMCq_1 are located continuously in the memory cell row MR_1. In some embodiments, the count value cells CMC1-1 to CMCq_1 are located continuously at the end of the memory cell row MR_1. When receiving the refresh command RFCMD, the reset circuit 122 rewrites the count value CV1 having the predetermined value PV to the count value cells CMC1-1 to CMCq_1.

When the access is performed, the counter 121 reads the count value CV1 from the count value cells CMC1-1 to CMCq_1, and rewrites the count value CV1 having the random value RV to the count value cells CMC1-1 to CMCq_1 when the count value CV1 is equal to the predetermined value PV.

In the embodiment, the count value cells CMC1-1 to CMCq_1 may be formed to be a count value register for the memory cell row MR_1. The count value cells CMC1-2 to CMCq_2 may be formed to be a count value register for the memory cell row MR_2. the count value cells CMC1_n to CMCq_n may be formed to be a count value register for the memory cell row MR_n.

Figure 4:
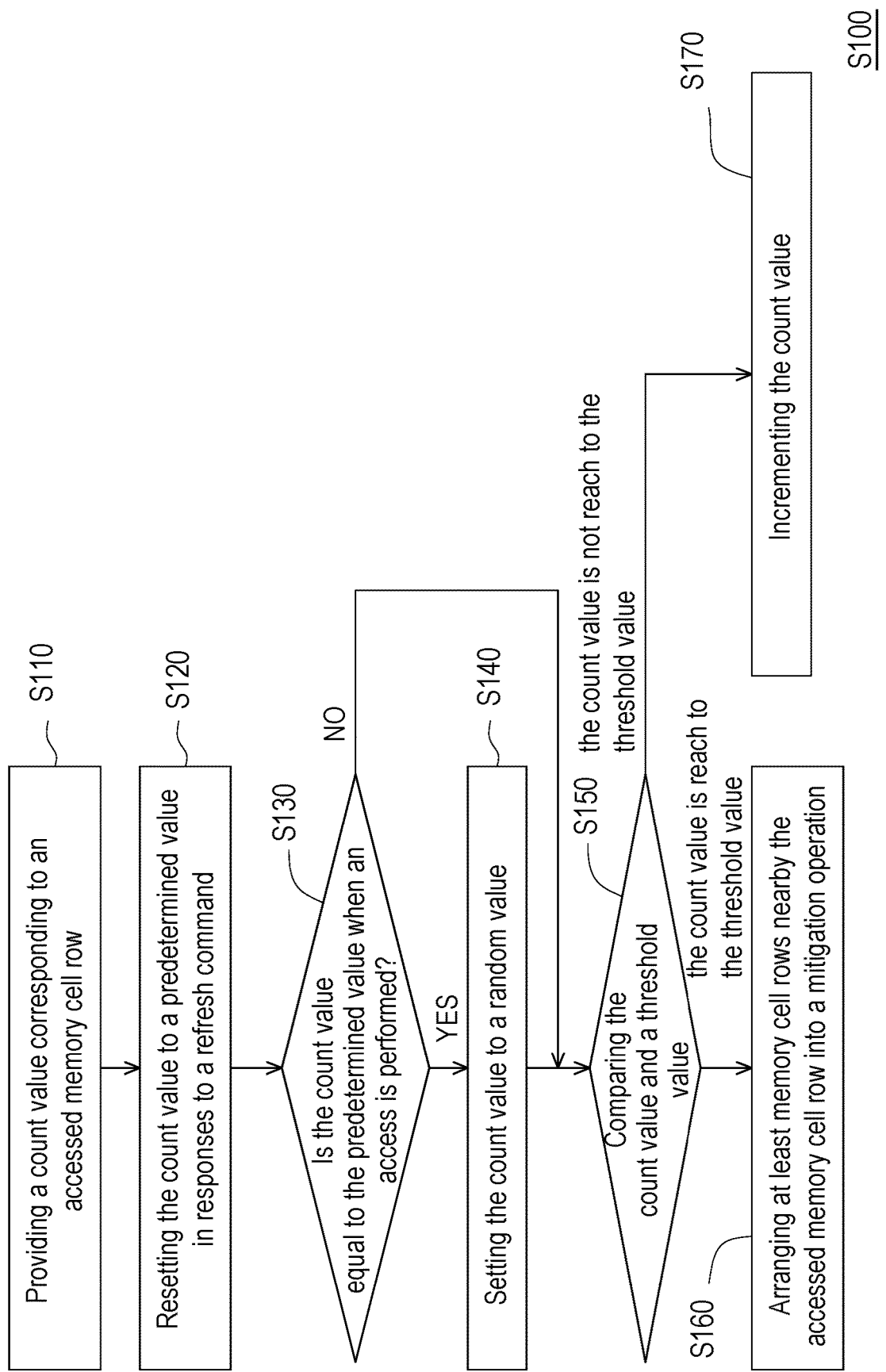
FIG. 4 illustrates a flow chart of a control method according an embodiment of the disclosure.

FIG. 4 illustrates a flow chart of a control method according an embodiment of the disclosure. Please refer to FIG. 1 and FIG. 4, in the embodiment, the control method S100 is applicable to the memory device 100. The control method S100 includes steps S110 to S170. In the step S110, the counter 121 provides the count value corresponding to the accessed memory cell row. In the step S120, the reset circuit 122 resets the count value to a predetermined value PV in responses to the refresh command RFCMD. The reset circuit 122 resets the count value when the control logic circuit 120 receives the refresh command RFCMD. The reset circuit 122 does not reset the count value when the control logic circuit 120 does not receive the refresh command RFCMD.

In the step S130, when the access is performed, the counter 121 determines the count value. When the count value is equal to the predetermined value PV, it means that the accessed memory cell row has refreshed before accessing. Therefore, the counter 121 sets the count value to the random value RV in the step S140. Then the comparator 123 compares the threshold value TV and the count value in the step S150.

On the other hand, when the count value is not equal to the predetermined value PV, it means that the accessed memory cell row is not refreshed before accessing. Therefore, the counter 121 does not set the count value to the random value RV. Then the comparator 123 compares the threshold value TV and the count value in the step S150.

In the step S150, when the count value reaches to the threshold value TV, the control logic circuit 120 at least arranges memory cell rows nearby the accessed memory cell row into the mitigation operation of row-hammer in the step S160. Then the control logic circuit 120 performs the step S120.

On the other hand, when the count value is lower than the threshold value TV, the counter 121 increments the count value in the step S170. Then the control logic circuit 120 performs the step S120.

Taking the memory cell row MR_m as an example, the count value CVm is provided in the step S110. The reset circuit 122 resets the count value CVm when the control logic circuit 120 receives the refresh command RFCMD in the step S120. The reset circuit 122 does not reset the count value CVm when the control logic circuit 120 does not receive the refresh command RFCMD.

In the step S130, when the access is performed, the counter 121 determines the count value CVm. When the count value CVm is equal to the predetermined value PV, the counter 121 sets the count value CVm to the random value RV in the step S140. On the other hand, when the count value CVm is not equal to the predetermined value PV, the counter 121 does not set the count value to the random value RV.

In the step S150, when the count value CVm reaches to the threshold value TV, the control logic circuit 120 at least arranges memory cell rows MR_(m−1) and MR_(m+1) into the mitigation operation of row-hammer in the step S160. Then the control logic circuit 120 performs the step S120.

In some embodiments, when the count value CVm is reach to the threshold value TV, the control logic circuit 120 arranges memory cell rows MR_(m−2), MR_(m−1), MR_(m+1) and MR_(m+2) into the mitigation operation. In some embodiments, when the count value CVm is reach to the threshold value TV, the control logic circuit 120 arranges memory cell rows MR_(m−1), MR_m and MR_(m+1) into the mitigation operation.

On the other hand, when the count value CVm is not reach to the threshold value TV, the counter 121 increments the count value CVm in the step S170. Then the control logic circuit 120 performs the step S120.

In view of the foregoing, the count value is reset to the predetermined value in responses to the refresh command. The count value is set to the random value when the count value is equal to the predetermined value and when the access is performed. The count value is set to the random value when the access is performed after being reset. Therefore, the external attackers cannot obtain the count value having the random value. The external attacker cannot obtain the mitigation operation of row-hammer of the disclosure. Therefore, the memory device mitigates the row-hammer attacks.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
   a memory array, comprising a plurality of memory cell rows; and
   a control logic circuit, coupled to the memory array, and configured to perform an access on the memory array, wherein the control logic circuit comprises:
   a reset circuit, configured to reset a count value corresponding to an accessed memory cell row among the plurality of memory cell rows to a predetermined value in responses to a refresh command;
   a counter, configured to count a number of the access performed on the plurality of memory cell rows to generate the count value, and set the count value to a random value when the count value is equal to the predetermined value and when the access is performed;
   and
   a comparator, configured to compare a threshold value and the count value,
   wherein when the count value corresponding to the accessed memory cell row reaches to the threshold value, the control logic circuit arranges memory cell rows nearby the accessed memory cell row into a mitigation operation.

2. The memory device of claim 1, wherein when the count value corresponding to the accessed memory cell row reaches to the threshold value, the control logic circuit arranges the accessed memory cell row and the memory cell rows nearby the accessed memory cell row into the mitigation operation.

3. The memory device of claim 1, wherein when the accessed memory cell row is accessed and when the count value is lower than the threshold value, the counter increments the count value of the accessed memory cell row.

4. The memory device of claim 1, wherein the counter comprising:
   a random value generator, configured to generate the random value.

5. The memory device of claim 1, wherein the accessed memory cell row comprises:
   a plurality of data cells, configured to store data; and
   a plurality of count value cells, configured to store the count value.

6. The memory device of claim 5, wherein when receiving the refresh command, the reset circuit rewrites the count value having the predetermined value to the plurality of count value cells.

7. The memory device of claim 5, wherein when the access is performed, the counter reads the count value from the plurality of count value cells, and rewrites the count value having the random value to the plurality of count value cells when the count value is equal to the predetermined value.

8. The memory device of claim 1, wherein:
   the count value comprises a plurality of bit values, and
   the reset circuit resets the plurality of bit values to a same logic value in responses to the refresh command.

9. A control method for controlling a memory device, comprising:
   providing a count value corresponding to an accessed memory cell row among a plurality of memory cell rows of a memory array of the memory device;
   resetting the count value to a predetermined value in responses to a refresh command;
   setting the count value to a random value when the count value is equal to the predetermined value and when the access is performed;
   comparing the count value and the threshold value; and
   arranging memory cell rows nearby the accessed memory cell row into a mitigation operation when the count value corresponding to the accessed memory cell row reaches to the threshold value.

10. The control method of claim 9, wherein arranging the memory cell rows nearby the accessed memory cell row into a mitigation operation when the count value corresponding to the accessed memory cell row reaches to the threshold value comprises:
    arranging the accessed memory cell row and the memory cell rows nearby the accessed memory cell row into the mitigation operation when the count value corresponding to the accessed memory cell row reaches to the threshold value.

11. The control method of claim 9, further comprising:
    incrementing the count value of the accessed memory cell row when the accessed memory cell row is accessed and when the count value is lower than the threshold value.

12. The control method of claim 9, wherein the accessed memory cell row comprises a plurality of data cells and a plurality of count value cells, wherein the plurality of data cells store data, wherein the count value cells, configured to store the count value, wherein setting the count value to a random value when the count value is equal to the predetermined value and when the access is performed comprises:
    reading the count value from the plurality of count value cells;
    setting the count value to the random value when the count value is equal to the predetermined value;
    generating the count value having the random value; and
    rewriting the count value having the random value to the plurality of count value cells.

13. The control method of claim 9, wherein the count value comprises a plurality of bit values, wherein resetting the count value to the predetermined value in responses to the refresh command comprises:
    resetting the plurality of bit values to a same logic value in responses to the refresh command.

* * * * *